(12) United States Patent
Smith

(10) Patent No.: US 8,912,442 B2
(45) Date of Patent: Dec. 16, 2014

(54) ACTIVE COVER PLATE

(75) Inventor: Jeremy Smith, Orem, UT (US)

(73) Assignee: SnapPower, Provo, UT (US)

( * ) Notice: Subject to any disclaimer, the term of this patent is extended or adjusted under 35 U.S.C. 154(b) by 53 days.

(21) Appl. No.: 13/461,915

(22) Filed: May 2, 2012

(65) Prior Publication Data

US 2013/0032594 A1 Feb. 7, 2013

Related U.S. Application Data

(60) Provisional application No. 61/574,344, filed on Aug. 1, 2011.

(51) Int. Cl.
*H02G 3/14* (2006.01)

(52) U.S. Cl.
CPC ..................... *H02G 3/14* (2013.01)
USPC .............................. 174/66; 174/67; 220/241

(58) Field of Classification Search
USPC ............... 174/66, 67; 220/241, 242; 439/136, 439/143; 312/328; 362/95
See application file for complete search history.

(56) References Cited

U.S. PATENT DOCUMENTS

| | | |
|---|---|---|
| 2,015,698 A | 12/1933 | Tiffany |
| 2,045,199 A | 6/1936 | Petersen |
| 2,227,549 A | 1/1941 | Mcneill |
| 2,575,820 A | 11/1951 | Linton |
| 2,580,056 A | 12/1951 | Wheeler |
| 2,749,381 A | 6/1956 | Farish |
| 2,880,285 A | 3/1959 | Robison |
| 2,908,743 A | 10/1959 | Premoshis |
| 2,934,590 A | 4/1960 | Thompson |
| 3,120,414 A | 2/1964 | Farish |
| 3,522,595 A | 8/1970 | White |
| 3,680,237 A | 8/1972 | Finnerty |
| 3,859,454 A | 1/1975 | Mann |
| 4,282,591 A | 8/1981 | Andreuccetti |
| 4,534,486 A | 8/1985 | Eidson |
| 4,617,613 A | 10/1986 | Rice |
| 4,774,641 A | 9/1988 | Rice |
| 5,016,398 A | 5/1991 | Fukunaga |
| 5,384,428 A | 1/1995 | Luu |
| 5,485,356 A | 1/1996 | Nguyen |
| 5,670,776 A | 9/1997 | Rothbaum |
| 5,683,166 A | 11/1997 | Lutzker |

(Continued)

FOREIGN PATENT DOCUMENTS

| | | |
|---|---|---|
| CN | 201311835 | 9/2009 |
| WO | PCT/US2012/046946 | 11/2012 |
| WO | PCT/US2013/067456 | 2/2014 |

*Primary Examiner* — Dhirubhai R Patel
(74) *Attorney, Agent, or Firm* — R. Camden Robinson

(57) ABSTRACT

One example embodiment includes a cover plate for an electrical receptacle. The cover plate includes a first conducting strip. The first conducting strip protrudes rearward from the cover plate and is configured to contact a first terminal of a receptacle, where the first terminal connects the receptacle to a power source. The cover plate also includes a first insulating means, where the first insulating means prevents the first conducting strip from contacting other conducting materials. The cover plate further includes a second conducting strip. The second conducting strip protrudes rearward from the cover plate and is configured to contact a second terminal of the receptacle, where the second terminal completes the connection of the receptacle to the power source. The cover plate additionally includes a second insulating means, where the second insulating means prevents the second conducting strip from contacting other conducting materials. The cover plate also includes a load.

20 Claims, 7 Drawing Sheets

(56) References Cited

U.S. PATENT DOCUMENTS

| | | |
|---|---|---|
| 5,816,682 A | 10/1998 | Marischen |
| 6,087,588 A | 7/2000 | Soules |
| 6,395,981 B1 | 5/2002 | Ford et al. |
| 6,423,900 B1 | 7/2002 | Soules |
| 7,247,793 B2 | 7/2007 | Hinkson |
| 7,360,912 B1 | 4/2008 | Savicki, Jr. |
| 7,506,990 B2 | 3/2009 | Glazner |
| 8,304,652 B2 | 11/2012 | McBain |
| 8,668,347 B2 * | 3/2014 | Ebeling .................. 362/95 |
| 2001/0046130 A1 | 11/2001 | Cunningham et al. |
| 2003/0124022 A1 | 7/2003 | Georges et al. |
| 2006/0072302 A1 | 4/2006 | Chien |
| 2009/0284385 A1 | 11/2009 | Tang et al. |
| 2012/0068612 A1 | 3/2012 | Ebeling |
| 2012/0156937 A1 | 6/2012 | Almouli |
| 2013/0221868 A1 | 8/2013 | Diotte |

* cited by examiner

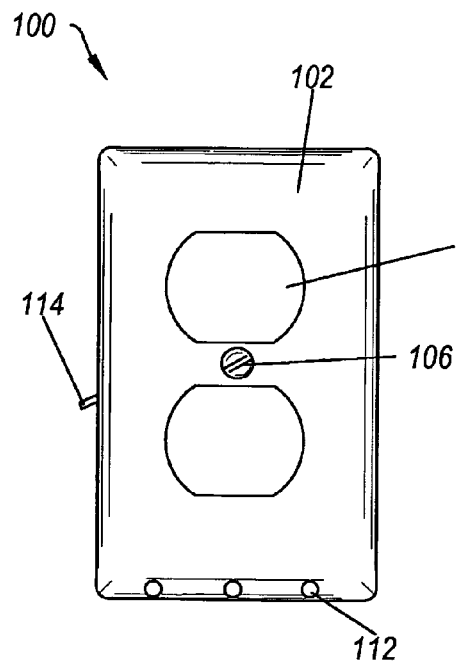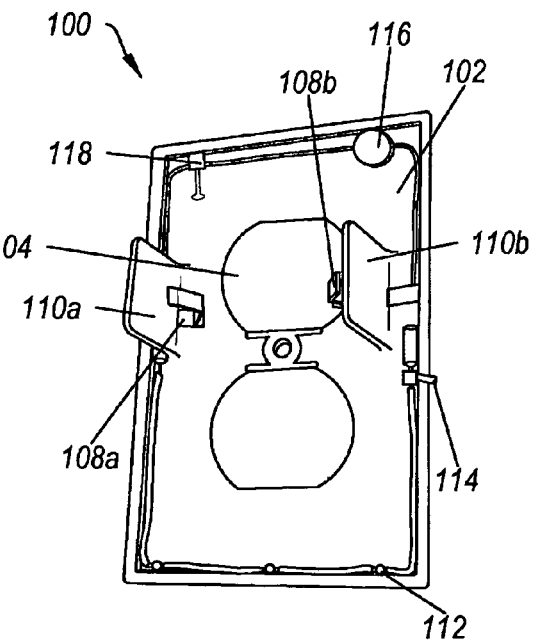
FIG. 1A  FIG. 1B
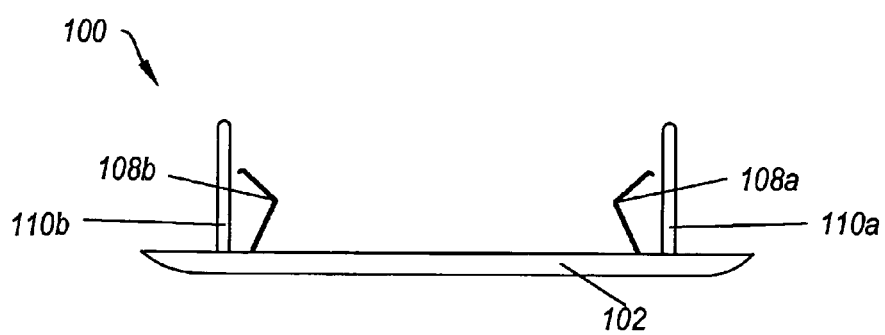
FIG. 1C

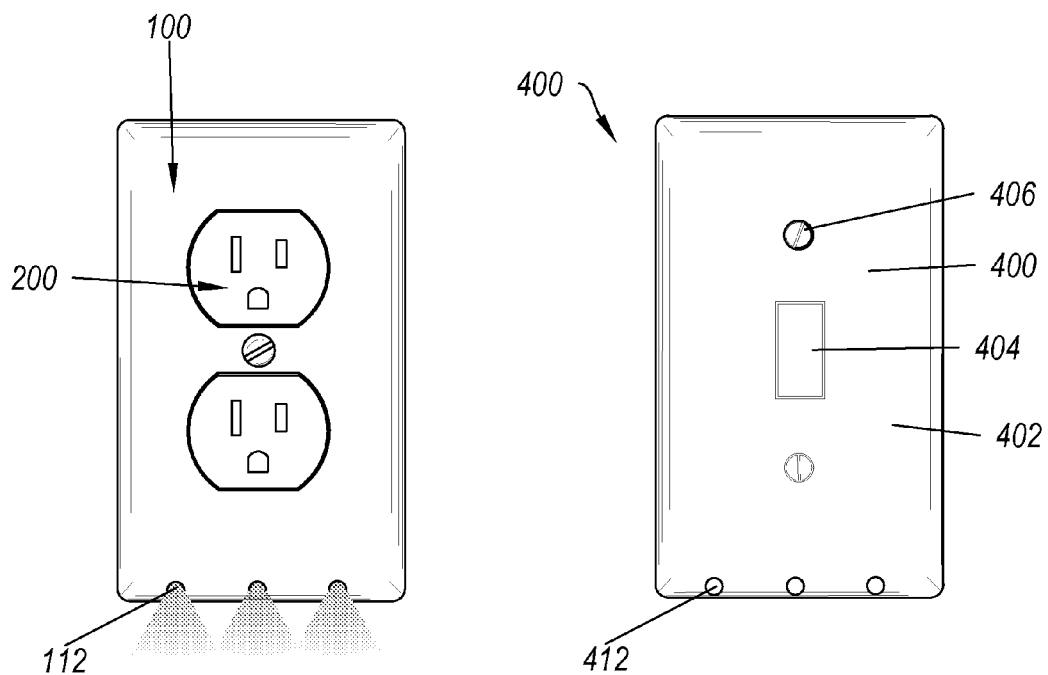
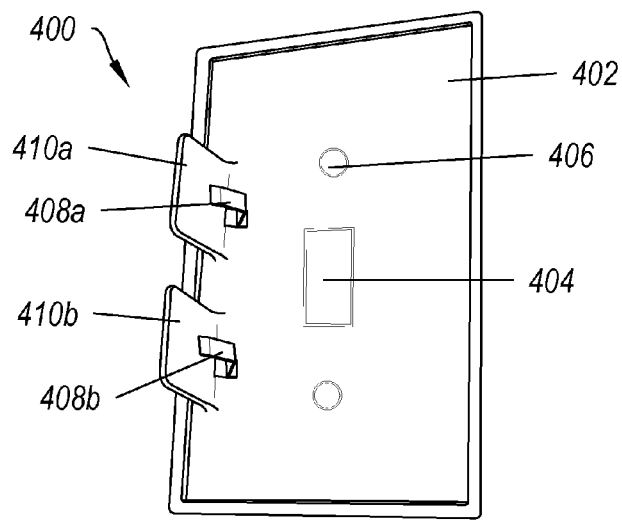

ACTIVE COVER PLATE

CROSS-REFERENCE TO RELATED APPLICATIONS

This application claims the benefit of and priority to U.S. Provisional Patent Application Ser. No. 61/574,344 filed on Aug. 1, 2011, which application is incorporated herein by reference in its entirety.

BACKGROUND OF THE INVENTION

Devices which remain in outlets continuously are quite common. For example, many people have night lights which are plugged into a particular outlet and remain there. These night lights provide a low light level in a particular area in order to allow limited visibility at night or in other conditions when ambient conditions to not provide adequate lighting for normal viewing.

However, night lights suffer from a number of drawbacks. For example, they require an outlet in the area. I.e., the light cannot be placed near switches or in other areas where a user may desire. Thus, in entryways or exits, either brighter lights must be used or a night light is not possible for installation. I.e., only areas with available outlets are available for lighting, irrespective of user preferences.

In addition, the installation of a night light blocks one or both outlets available at a receptacle. I.e., as the night light is plugged in, it uses the outlet, which cannot be used for other devices. If the user wishes to use the outlet, he/she must unplug the night light to free the outlet, forcing the user to select one or the other for use. Some night lights have a built in outlet allowing other devices to be plugged into the night light, and thus receive power from the outlet. However, the night light may still take enough power to limit the power available to the other device.

Further, night lights necessarily protrude from the outlet. In hallways or other areas this may result in the night light being bumped or otherwise displaced. This can cause harm to the person bumping into the nightlight or to the nightlight itself. In addition, it may partially unplug the nightlight, causing an electrocution or fire hazard.

Direct wiring to the night light is possible. I.e., the night light can be wired directly to electrical power without using a plug. However, this makes installation and replacement time consuming and dangerous. For example, if the wiring is not done correctly there can be a danger of electrocution or a fire hazard.

Accordingly, there is a need in the art for an active cover plate that does not protrude from an outlet. In addition, there is a need in the art for the cover plate to be easily installed or replaced. Further, there is a need in the art for the cover plate to be available for installation at other receptacle types, such as switches. Moreover, there is a need in the art for the cover plate to leave outlets free for other uses. Also, there is a need in the art for the cover plate to install safely, in accordance with all electrical codes.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One example embodiment includes a cover plate for an electrical receptacle. The cover plate includes a first conducting strip. The first conducting strip protrudes rearward from the cover plate and is configured to contact a first terminal of a receptacle, where the first terminal connects the receptacle to a power source. The cover plate also includes a first insulating means, where the first insulating means prevents the first conducting strip from contacting other conducting materials. The cover plate further includes a second conducting strip. The second conducting strip protrudes rearward from the cover plate and is configured to contact a second terminal of the receptacle, where the second terminal completes the connection of the receptacle to the power source. The cover plate additionally includes a second insulating means, where the second insulating means prevents the second conducting strip from contacting other conducting materials. The cover plate also includes a load.

Another example embodiment includes a cover plate for an electrical receptacle. The cover plate includes a first conducting strip. The first conducting strip protrudes rearward from the cover plate and is configured to contact a first terminal of a receptacle, where the first terminal connects the receptacle to a power source. The cover plate also includes a first insulating means, where the first insulating means prevents the first conducting strip from contacting conducting materials other than the first terminal. The cover plate further includes a second conducting strip. The second conducting strip protrudes rearward from the cover plate and is configured to contact a second terminal of the receptacle, where the second terminal completes the connection of the receptacle to the power source. The cover plate additionally includes a second insulating means, where the second insulating means prevents the second conducting strip from contacting conducting materials other than the second terminal. The cover plate also includes a load and wiring embedded within the cover plate. The wiring connects the first conducting strip, the load and the second conducting strip.

Another example embodiment includes a cover plate for an electrical receptacle. The cover plate includes a faceplate. The faceplate is configured to cover the opening of an electrical box and includes an aperture, where the aperture is configured to provide access to a receptacle within the electrical box. The cover plate also includes a first conducting strip. The first conducting strip protrudes rearward from the faceplate and is configured to contact a first terminal of a receptacle, where the first terminal connects the receptacle to a power source. The cover plate also further includes a first insulating means, where the first insulating means prevents the first conducting strip from contacting conducting materials other than the first terminal. The cover plate additionally includes a second conducting strip. The second conducting strip protrudes rearward from the faceplate and is configured to contact a second terminal of the receptacle, where the second terminal completes the connection of the receptacle to the power source. The cover plate also includes a second insulating means, where the second insulating means prevents the second conducting strip from contacting conducting materials other than the second terminal. The cover plate further includes a light source. The light source is configured to convert electrical power to visible light and project the light frontward from the faceplate. The cover plate additionally includes wiring embedded within the faceplate. The wiring connects the first conducting strip, the load and the second conducting strip.

These and other objects and features of the present invention will become more fully apparent from the following description and appended claims, or may be learned by the practice of the invention as set forth hereinafter.

BRIEF DESCRIPTION OF THE DRAWINGS

To further clarify various aspects of some example embodiments of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which:

FIG. 1A illustrates a front view of the cover plate;

FIG. 1B illustrates a rear perspective view of the cover plate;

FIG. 1C illustrates a top view of the cover plate;

FIG. 3B illustrates a front view of the cover plate in combination with the outlet;

FIG. 4A illustrates a front view of the cover plate;

FIG. 4B illustrates a rear perspective view of the cover plate;

DETAILED DESCRIPTION OF SOME EXAMPLE EMBODIMENTS

Figure 2:
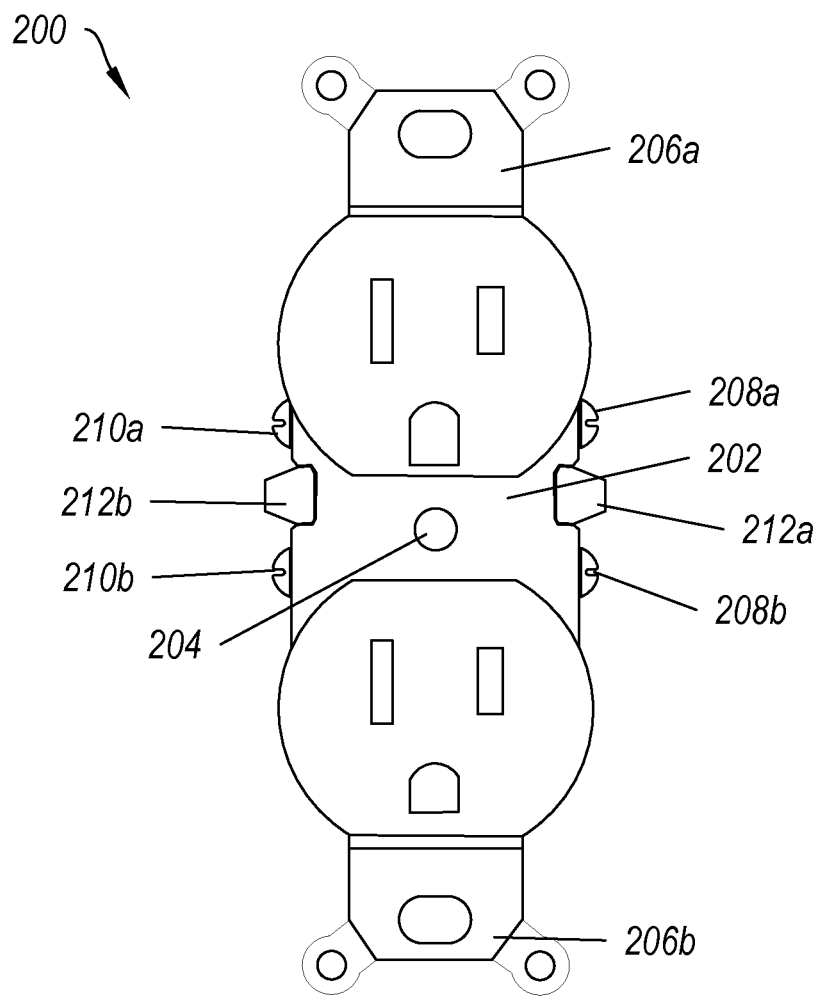
FIG. 2 illustrates an example of an outlet.

Reference will now be made to the figures wherein like structures will be provided with like reference designations. It is understood that the figures are diagrammatic and schematic representations of some embodiments of the invention, and are not limiting of the present invention, nor are they necessarily drawn to scale.

FIGS. 1A, 1B and 1C illustrate an example of a cover plate 100. FIG. 1A illustrates a front view of the cover plate 100; FIG. 1B illustrates a rear perspective view of the cover plate 100; and FIG. 1C illustrates a top view of the cover plate 100. In at least one implementation, the cover plate 100 is configured to be placed over an outlet. I.e., the cover plate 100 prevents access to an electrical box containing an outlet unless removed.

FIGS. 1A, 1B and 1C show that the cover plate 100 can include a faceplate 102. In at least one implementation, the faceplate 102 can mate with the outlet to prevent access to the electrical box in which the outlet is mounted. I.e., the faceplate can, in combination with the outlet, prevent access to the wires and connections within the electrical box. The faceplate 102 can include an insulating material to prevent electrocution of a user. For example, the faceplate 102 can include plastic. The faceplate 102 can be a single color or can include designs as desired.

FIGS. 1A, 1B and 1C also show that the cover plate 100 can include one or more apertures 104. In at least one implementation, the one or more apertures 104 can provide access to the outlet. I.e., the cover plate 100 covers a portion of an outlet but allows access to another portion. For example, the faceplate 102 can prevent access to electrical connections or wiring. In contrast, the one or more apertures 104 can allow access to the actual outlet.

FIGS. 1A, 1B and 1C further show that the cover plate 100 can include an attachment 106. In at least one implementation, the attachment 106 can include a screw hole or attached screw. The screw then is inserted into a bore in the outlet which holds the cover plate 100 in place relative to the outlet. Additionally or alternatively, the attachment 106 can include one or more tabs that are attached to the outlet or electrical box. I.e., the tabs are inserted into a hole and are retained by a flange or other mechanism within the outlet or electrical box.

FIGS. 1A, 1B and 1C additionally show that the cover plate 100 can include a first conducting strip 108a and a second conducting strip 108b (collectively "conducting strips 108"). In at least one implementation, the conducting strips 108 can allow the cover plate to draw power. I.e., the conducting strips 108 come in contact with the power connectors of the outlet, drawing power as needed, as described below.

One of skill in the art will appreciate that the conducting strips 108 can be connected to a power supply in some other way. In particular, the conducting strips 108 can be powered wirelessly. For example, the electrical box can include a hard-wired inductance mechanism. The conducting strips 108 can be attached to another inductance mechanism, which allows power transfer without a physical connection.

FIGS. 1A, 1B and 1C also show that the cover plate 100 can include a first insulating tab 110a and a second insulating tab 110b (collectively "insulating tabs 110"). In at least one implementation, the insulating tabs 110 can prevent the conducting strips from forming a circuit with external materials. I.e., as the conducting strips 108 come in contact with the power connectors of the outlet, they bend outward. This flexibility insures that the conducting strips 108 remain in contact with the power connectors. However, it can also force the conducting strips 108 toward wires, the electrical box or other materials in the areas. The insulating tabs 110 prevent the conducting strips from contacting the wires, electrical box or other materials. In addition, the insulating tabs 110 prevent arcing if the conducting strips 108 get too close to the wires, electrical box or other materials.

The insulating tabs 110 can be the same material as the faceplate 102 or can be attached to the faceplate 102. I.e., the faceplate 102 and the insulating tabs 110 can be constructed of a single piece of insulating material. Additionally or alternatively, the insulating tabs 110 can be manufactured separately and then attached to the faceplate 102. One of skill in the art will appreciate that the attachment method should retain the insulating capabilities of the insulating tabs 110. For example, the insulating tabs 110 can be attached to the faceplate 102 using an insulating glue.

FIGS. 1A, 1B and 1C further show that the cover plate 100 can include a load 112. In at least one implementation, the load 112 can include any electrical device which requires power. I.e., the load 112 can include an electrical device embedded within the cover plate 100. For example, the load 112 can include lights, motion detectors, photocells, wireless nodes, blue tooth connectors, smoke detectors, carbon monoxide detectors, cameras, heat detectors, speakers, microphones or any other desired electrical device.

FIGS. 1A, 1B and 1C exemplarily show a load 112 which includes a bank of light emitting diodes. A light-emitting diode (LED) is a semiconductor light source. LEDs can produce high intensity light with less power than conventional light sources. In particular, LEDs convert a higher percentage of input power to light and a lower percentage to heat or other waste.

FIGS. 1A, 1B and 1C additionally show that the cover plate 100 can include a power switch 114. In at least one implementation, the power switch 114 can allow a user to turn on or off or dim the load 112. For example, if the load 112 is a light, the power switch 114 can allow the user to select the brightness of the light or to turn off the light such that it does not produce light.

FIGS. 1A, 1B and 1C also show that the cover plate 100 can include a battery backup 116. In at least one implementation, the battery backup 116 can ensure that the load 112 continues to receive power for a time, even if power from the power source is discontinued. I.e., the battery backup 116 can be charged by the power source when the power source is active. When the power source is inactive, the battery backup 116 can supply power to the load 112. The battery backup can be configured to provide power to the load 112 but not the power source so that when the power source is inactive it does not act as an additional load on the battery backup 116.

FIGS. 1A, 1B and 1C further show that the cover plate 100 can include a network device 118. In at least one implementation, the network device 118 can allow the cover plate 100 to connect to a network. For example, the network device 118 can include an antenna. Additionally or alternatively, the network device 118 can include an Ethernet port or any other connection capable of connecting the cover plate 100 to a desired network.

In at least one implementation, the network can be used to connect multiple cover plates 100 to one another. Additionally or alternatively, the network can allow the cover plate to communicate with a controller or over the Web. The network exemplarily includes the Internet, including a global internetwork formed by logical and physical connections between multiple wide area networks and/or local area networks and can optionally include the World Wide Web ("Web"), including a system of interlinked hypertext documents accessed via the Internet. Alternately or additionally, the network includes one or more cellular RF networks and/or one or more wired and/or wireless networks such as, but not limited to, 802.xx networks, Bluetooth access points, wireless access points, IP-based networks, or the like. For example, the network can include cloud based networking and computing. The network can also include servers that enable one type of network to interface with another type of network.

FIG. 2 illustrates an example of an outlet 200. In at least one implementation, the outlet 200 can provide power to an external device. I.e., the outlet 200 is configured to receive a plug of an external device and provide power to the plug. The outlet 200 can be direct wired to an electrical power source. For example, the outlet 200 can be placed within a home or business, with wiring from the building power supply.

FIG. 2 shows that the outlet 200 can include a body 202. In at least one implementation, the body 202 is configured to receive a plug from an external device. For example, the body 202 includes sockets that allow the conducting leads of a plug to be inserted and make contact, which allows current flow to the plug but prevents current flow to anything other than the plug. The body 202 can include multiple sockets, each of which is configured to receive a plug.

FIG. 2 also shows that the outlet 200 can include a bore 204. In at least one implementation, the bore 204 is configured to receive the attachment of a cover plate. In particular, the bore 204 can allow the attachment of the cover plate to secure the cover plate relative to the outlet 200. For example, the bore 204 can include a threaded opening for receiving a screw or any other device for the cover plate attachment. The cover plate can be configured to mate with the body 202 in order to maintain the proper orientation, such that a single bore 204 can retain the cover plate.

FIG. 2 further shows that the outlet 200 can include a first mounting piece 206a and a second mounting piece 206b (collectively "mounting pieces 206"). In at least one implementation, the mounting pieces 206 are configured to attach the outlet 200 to an electrical box. I.e., the mounting pieces 206 secure the outlet 200 in place, ensuring that it does not move or otherwise reorient as the user attempts to insert or remove a plug from the body 202. The mounting pieces 206 can include "yokes" or tabs that are configured to prevent the outlet 200 from being installed too deeply into the electrical box. I.e., the yokes can keep the mounting pieces 206 approximately flush with the wall during installation.

FIG. 2 additionally shows that the outlet 200 can include a first power screw 208a and a second power screw 208b (collectively "power screws 208"). In at least one implementation, the power screws 208 allow the outlet 200 to be connected to an active power source. Additionally or alternatively, the power screws 208 can allow the outlet 200 to be connected to other active loads, such as switches, additional outlets or any other active load. The outlet 200 may include power inputs which allows a wire to be inserted directly without the need to attach the wire to the power screws 208. One of skill in the art will appreciate that such inputs remain connected to the power screws 208 such that a wire from another active load and connected to the power screws 208 is able to provide power to the additional active load.

FIG. 2 also shows that the outlet 200 can include a first neutral screw 210a and a second neutral screw 210b (collectively "neutral screws 210"). In at least one implementation, the neutral screws 210 return power to the power source, completing the electrical circuit. I.e., power flows from the power source to the power screws 208, through the external device via the plug, to the neutral screws 210 and back to the power source forming an electrical circuit. Additionally or alternatively, the neutral screws 210 can allow the outlet 200 to be connected to other active loads, such as switches, additional outlets or any other active load. The outlet 200 may include power inputs which allows a wire to be inserted directly without the need to attach the wire to the neutral screws 210. One of skill in the art will appreciate that such inputs remain connected to the neutral screws 210 such that a wire from another active load and connected to the neutral screws 210 is able to provide power to the additional active load.

One of skill in the art will appreciate that the power screws 208 and the neutral screws 210 can be of any desired voltage. For example, voltage can include 100V, 120 V, 220 V, 230 V or any other desired voltage. I.e., the voltage between the power screws 208 and the neutral screws 210 can accommodate any voltage preference or standard.

FIG. 2 further shows that the outlet 200 can include a first connecting tab 212a and a second connecting tab 212b (collectively "connecting tabs 212"). In at least one implementation, the connecting tabs 212 allow a single wire to be connected to the outlet 200. I.e., the first connecting tab 212a connects the first power screw 208a and the second power screw 208b such that a wire connected to the first power screw 208a is also connected to the second power screw 208b and vice versa. Likewise, the second connecting tab 212b connects the first neutral screw 210a and the second neutral screw 208b such that a wire connected to the first neutral screw 210a is also connected to the second neutral screw 210b and vice versa.

One of skill in the art will appreciate that the first connecting tab 212a, the second connecting tab 212b or both can be removed during installation. Removal of the first connecting tab 212a allows separate power inputs to the first power screw 208a and the second power screw 208b. Likewise, removal of the second connecting tab 212b allows separate neutral connections to the first neutral screw 210a and the second neutral screw 210b. Separate connections may be desirable if the different sockets are to be placed on separate circuits, operated with a switch or should otherwise be independent of one another.

Figure 3A:
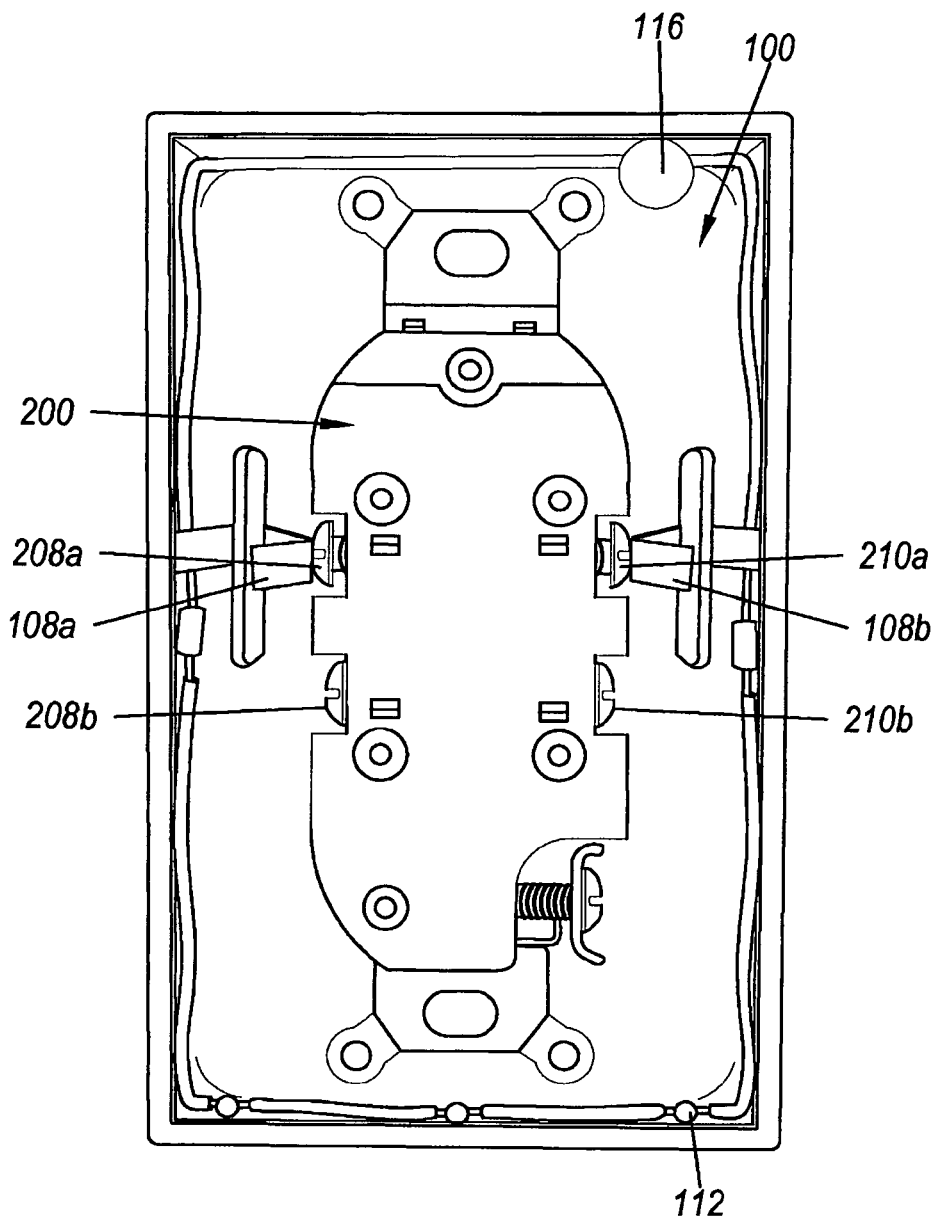
FIG. 3A illustrates a rear view of the cover plate in combination with the outlet.

FIGS. 3A and 3B illustrate a cover plate 100 in combination with an outlet 200. FIG. 3A illustrates a rear view of the cover plate 100 in combination with the outlet 200; and FIG. 3B illustrates a front view of the cover plate 100 in combination with the outlet 200. In at least one implementation, the cover plate 100 is configured to be installed on the outlet 200 without the need for hardwiring the cover plate 100. In addition, the cover plate 100 can electrically connect to the outlet 200 without occupying a socket in the outlet.

FIGS. 3A and 3B show that the first conducting strip 108a is in contact with the first power screw 208a. In at least one implementation, the first conducting strip 108a receives power supplied to the first power screw 208a. The power can then be delivered to a load 112 within the cover plate 100. One of skill in the art will appreciate that the first conducting strip 108a making contact with the first power screw 208a is exemplary only. I.e., the first conducting strip 108a can make contact with the second power screw 208b, the first connecting tab 212a, FIG. 2 or can receive power in some other way.

FIGS. 3A and 3B also show that the second conducting strip 108b is in contact with the first neutral screw 210a. In at least one implementation, the second conducting strip 108b completes the circuit with the first neutral screw 210a. I.e., power is received in the first conducting strip 108a from the first power screw 208a, delivered to the load 112, then returned to the first neutral screw 210a using the second conducting strip 108b. One of skill in the art will appreciate that the second conducting strip 108b making contact with the first neutral screw 210a is exemplary only. I.e., the second conducting strip 108b can make contact with the second neutral screw 210b, the second connecting tab 212b, FIG. 2 or can complete the circuit in some other way.

FIGS. 3A and 3B further show that the load 112 is active at least when power is being supplied to the first power screw 208a. I.e., as long as a socket receiving power from the first power screw 208a could be used as a power supply for a plug, the load 112 is receiving power. One of skill in the art will appreciate that if the socket is controlled by a switch then the load 112 will likewise be controlled by the switch.

FIGS. 3A and 3B additionally show that the battery backup 116 can complete a circuit with the first conducting strip 108a and the second conducting strip 108b. That is, as long as a socket receiving power from the first power screw 208a could be used as a power supply for a plug, the battery backup 116 is receiving power. Thus, if power is discontinued to the power screw 208a, the battery backup 116 is no longer receiving power. However, the battery backup 116 can continue to supply power to the load 112, allowing it to remain active for a time.

FIGS. 4A and 4B illustrate an alternative example of a cover plate 400. FIG. 4A illustrates a front view of the cover plate 400; and FIG. 4B illustrates a rear perspective view of the cover plate 400. In at least one implementation, the cover plate 400 can be used with an alternative electric device, such as a light switch. One of skill in the art will appreciate that the cover plate 400 can be configured for use at any electrical box.

FIGS. 4A and 4B show that the cover plate 400 can include a faceplate 402. In at least one implementation, the faceplate 402 can mate with the switch to prevent access to the electrical box in which the switch is mounted. I.e., the faceplate can, in combination with the switch, prevent access to the wires and connections within the electrical box. The faceplate 402 can include an insulating material to prevent electrocution of a user. For example, the faceplate 402 can include plastic. The faceplate 402 can be a single color or can include designs as desired.

FIGS. 4A and 4B also show that the cover plate 400 can include one or more apertures 404. In at least one implementation, the one or more apertures 404 can provide access to the switch. I.e., the cover plate 400 covers a portion of a switch, but allows access to another portion. For example, the faceplate 402 can prevent access to electrical connections or wiring. In contrast, the one or more apertures 404 can allow access to the actual switch.

FIGS. 4A and 4B further show that the cover plate 400 can include an attachment 406. In at least one implementation, the attachment 406 can include a screw hole or attached screw. The screw then is inserted into a bore in the switch or electrical box which holds the cover plate 400 in place relative to the switch. Additionally or alternatively, the attachment 406 can include one or more tabs that are attached to the switch or electrical box. I.e., the tabs are inserted into a hole and are retained by a flange or other mechanism within the switch or electrical box.

FIGS. 4A and 4B additionally show that the cover plate 400 can include a first conducting strip 408a and a second conducting strip 408b (collectively "conducting strips 408"). In at least one implementation, the conducting strips 408 can allow the cover plate to draw power. I.e., the conducting strips 408 come in contact with the power connectors of the switch, drawing power as needed, as described below.

FIGS. 4A and 4B also show that the cover plate 400 can include a first insulating tab 410a and a second insulating tab 410b (collectively "insulating tabs 410"). In at least one implementation, the insulating tabs 410 can prevent the conducting strips from forming a circuit with external materials. I.e., as the conducting strips 408 come in contact with the power connectors of the switch, they bend outward. This flexibility insures that the conducting strips 408 remain in contact with the power connectors. However, it can also force the conducting strips 408 toward wires, the electrical box or other materials in the areas. The insulating tabs 410 prevent the conducting strips from contacting the wires, electrical box or other materials. In addition, the insulating tabs 410 prevent arcing if the conducting strips 408 get too close to the wires, electrical box or other materials.

The insulating tabs 410 can be the same material as the faceplate 402 or can be attached to the faceplate 402. I.e., the faceplate 402 and the insulating tabs 410 can be constructed of a single piece of insulating material. Additionally or alternatively, the insulating tabs 410 can be manufactured separately and then attached to the faceplate 402. One of skill in the art will appreciate that the attachment method should retain the insulating capabilities of the insulating tabs 410. For example, the insulating tabs 410 can be attached to the faceplate 402 using an insulating glue.

FIGS. 4A and 4B further show that the cover plate 400 can include a load 412. In at least one implementation, the load 412 can include any electrical device which requires power. I.e., the load 412 can include an electrical device embedded within the cover plate 400. For example, the load 412 can include lights, motion detectors, photocells, wireless nodes, blue tooth connectors, smoke detectors, carbon monoxide detectors, cameras, heat detectors, speakers, microphones or any other desired electrical device.

Figure 5:
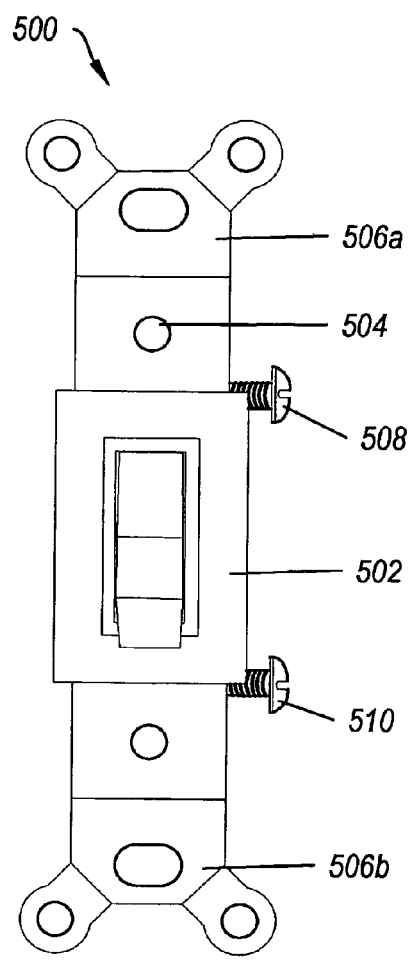
FIG. 5 illustrates an example of a switch.

FIG. 5 illustrates an example of a switch 500. In at least one implementation, the switch 500 can provide power to an external device which a user desires to turn on and off. I.e., the switch 500 is configured to allow a user to control whether a device connected to the switch is on or off. The switch 500 can be hardwired to the device or can be connected via an outlet and plug or though some other indirect connection.

FIG. 5 shows that the switch 500 can include a body 502. In at least one implementation, the body 502 can include a movable portion that allows the user to control the state of the connected electrical device. For example, the body 502 can include a toggle, which can be moved as desired to change the on/off state of the connected electrical device. Additionally or alternatively, the body 502 can include a button, or touch screen or some other mechanism for detecting user control.

FIG. 5 also shows that the switch 500 can include a bore 504. In at least one implementation, the bore 504 is configured to receive the attachment of a cover plate. In particular, the bore 504 can allow the attachment of the cover plate to secure the cover plate relative to the switch 500. For example, the bore 500 can include a threaded opening for receiving a screw or any other device for the cover plate attachment. The cover plate can be configured to mate with the body 502 in order to maintain the proper orientation.

FIG. 5 further shows that the switch 500 can include a first mounting piece 506a and a second mounting piece 506b (collectively "mounting pieces 506"). In at least one implementation, the mounting pieces 506 are configured to attach the switch 500 to an electrical box. I.e., the mounting pieces 506 secure the switch 500 in place, ensuring that it does not move or otherwise reorient as the user operates the portion of the body 502 which allows the user to change the on/off state of the connected electrical device. The mounting pieces 506 can include "yokes" or tabs that are configured to prevent the switch 500 from being installed too deeply into the electrical box. I.e., the yokes can keep the mounting pieces 506 approximately flush with the wall during installation.

FIG. 5 additionally shows that the switch 500 can include a power screw 508. In at least one implementation, the power screw 508 allows the switch 500 to be connected to an active power source. Additionally or alternatively, the power screw 508 can allow the switch 500 to be connected to other active loads, such as additional switches, outlets or any other active load. The switch 500 may include a power input which allows a wire to be inserted directly without the need to attach the wire to the power screw 508. One of skill in the art will appreciate that such inputs remain connected to the power screw 508 such that a wire from another active load and connected to the power screw 508 is able to provide power to the additional active load.

FIG. 5 also shows that the switch 500 can include a neutral screw 510. The neutral screw 510 can allow the switch 500 to be connected to other active loads, such as additional switches, outlets or any other active load. The switch 500 may include a power input which allows a wire to be inserted directly without the need to attach the wire to the neutral screw 510. One of skill in the art will appreciate that such inputs remain connected to the neutral screw 510 such that a wire from another active load and connected to the neutral screw 510 is able to provide power to the additional active load.

One of skill in the art will appreciate that the power screw 508 and the neutral screw 510 can be of any desired voltage. For example, voltage can include 100V, 120 V, 220 V, 230 V or any other desired voltage. I.e., the voltage between the power screw 508 and the neutral screw 510 can accommodate any voltage preference or standard.

Figure 6:
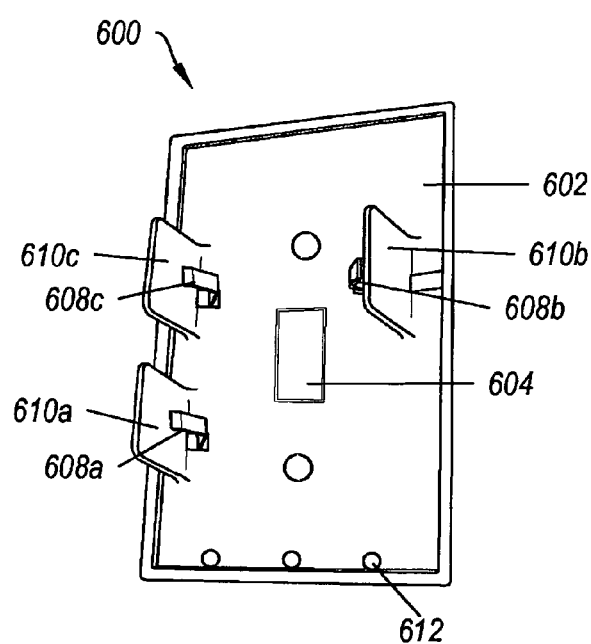
FIG. 6 illustrates an alternative example of a cover plate.

FIG. 6 illustrates an alternative example of a cover plate 600. In at least one implementation, the cover plate 600 can be used with an alternative electric device, such as a 3-way light switch. I.e., modifications to the cover plate 600 can allow for connection to any desired device within an electrical box, even though the actual wiring configuration may vary depending on the device.

FIG. 6 shows that the cover plate 600 can include a faceplate 602. In at least one implementation, the faceplate 602 can mate with the 3-way switch to prevent access to the electrical box in which the 3-way switch is mounted. I.e., the faceplate can, in combination with the 3-way switch, prevent access to the wires and connections within the electrical box. The faceplate 602 can include an insulating material to prevent electrocution of a user. For example, the faceplate 602 can include plastic. The faceplate 602 can be a single color or can include designs as desired.

FIG. 6 also shows that the cover plate 600 can include one or more apertures 604. In at least one implementation, the one or more apertures 604 can provide access to the 3-way switch. I.e., the cover plate 600 covers a portion of the 3-way switch, but allows access to another portion. For example, the faceplate 602 can prevent access to electrical connections or wiring. In contrast, the one or more apertures 604 can allow access to the actual 3-way switch.

FIG. 6 additionally shows that the cover plate 600 can include a first conducting strip 608a, a second conducting strip 608b and a third conducting strip 608c (collectively "conducting strips 608"). In at least one implementation, the conducting strips 608 can allow the cover plate to draw power. I.e., the conducting strips 608 come in contact with the power connectors of the 3-way switch, drawing power as needed, as described below.

FIG. 6 also shows that the cover plate 600 can include a first insulating tab 610a, a second insulating tab 610b and a third insulating tab 610c (collectively "insulating tabs 610"). In at least one implementation, the insulating tabs 610 can prevent the conducting strips from forming a circuit with external materials. I.e., as the conducting strips 608 come in contact with the power connectors of the 3-way switch, they bend outward. This flexibility insures that the conducting strips 608 remain in contact with the power connectors. However, it can also force the conducting strips 608 toward wires, the electrical box or other materials in the areas. The insulating tabs 610 prevent the conducting strips from contacting the wires, electrical box or other materials. In addition, the insulating tabs 610 prevent arcing if the conducting strips 608 get too close to the wires, electrical box or other materials.

The insulating tabs 610 can be the same material as the faceplate 602 or can be attached to the faceplate 602. I.e., the faceplate 602 and the insulating tabs 610 can be constructed of a single piece of insulating material. Additionally or alternatively, the insulating tabs 610 can be manufactured separately and then attached to the faceplate 602. One of skill in the art will appreciate that the attachment method should retain the insulating capabilities of the insulating tabs 610. For example, the insulating tabs 610 can be attached to the faceplate 602 using an insulating glue.

FIG. 6 further shows that the cover plate 600 can include a load 612. In at least one implementation, the load 612 can include any electrical device which requires power. I.e., the load 612 can include an electrical device embedded within the cover plate 600. For example, the load 612 can include lights, motion detectors, photocells, wireless nodes, blue tooth connectors, smoke detectors, carbon monoxide detectors, cameras, heat detectors, speakers, microphones or any other desired electrical device.

Figure 7:
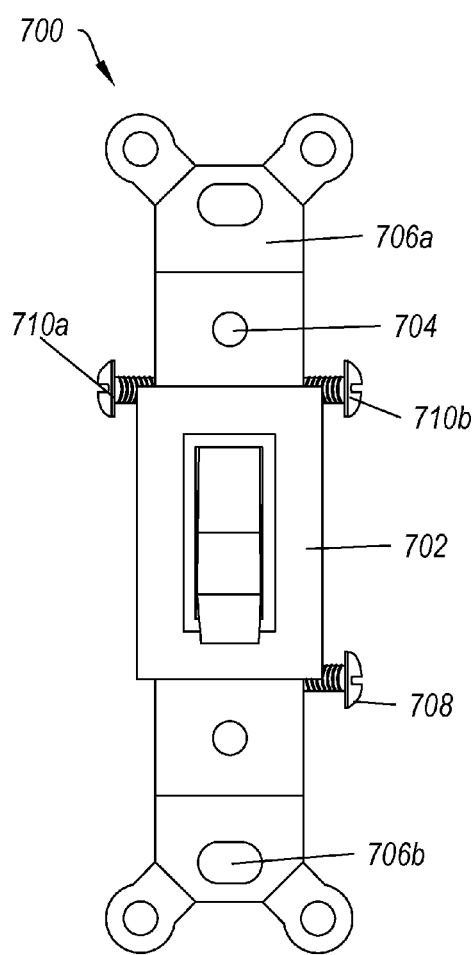
FIG. 7 illustrates an example of a 3-way switch.

FIG. 7 illustrates an example of a 3-way switch 700. In at least one implementation, the 3-way switch 700 can provide power to an external device which a user desires to turn on and off in combination with another switch. I.e., the 3-way switch 700 is configured to allow a user to control whether a device connected to the 3-way switch is on or off. The device is on when both switches are in the same configuration and off when both switches are in a different configuration. The 3-way switch 700 can be hardwired to the device or can be connected via an outlet and plug or though some other indirect connection.

FIG. 7 shows that the 3-way switch 700 can include a body 702. In at least one implementation, the body 702 can include a movable portion that allows the user to control the state of the connected electrical device. For example, the body 702 can include a toggle, which can be moved as desired to change the on/off state of the connected electrical device. Additionally or alternatively, the body 702 can include a button, or touch screen or some other mechanism for detecting user control.

FIG. 7 also shows that the 3-way switch 700 can include a bore 704. In at least one implementation, the bore 704 is configured to receive the attachment of a cover plate. In particular, the bore 704 can allow the attachment of the cover plate to secure the cover plate relative to the 3-way switch 700. For example, the bore 700 can include a threaded opening for receiving a screw or any other device for the cover plate attachment. The cover plate can be configured to mate with the body 702 in order to maintain the proper orientation.

FIG. 7 further shows that the 3-way switch 700 can include a first mounting piece 706a and a second mounting piece 706b (collectively "mounting pieces 706"). In at least one implementation, the mounting pieces 706 are configured to attach the outlet to an electrical box. I.e., the mounting pieces 706 secure the outlet in place, ensuring that it does not move or otherwise reorient as the user operates the portion of the body 702 which allows the user to change the on/off state of the connected electrical device.

FIG. 7 additionally shows that the 3-way switch 700 can include a power screw 708. In at least one implementation, the power screw 708 allows the 3-way switch 700 to be connected to an active power source. Additionally or alternatively, the power screw 708 can allow the 3-way switch 700 to be connected to other active loads, such as additional 3-way switches, outlets or any other active load. The 3-way switch 700 may include a power input which allows a wire to be inserted directly without the need to attach the wire to the power screw 708. One of skill in the art will appreciate that such inputs remain connected to the power screw 708 such that a wire from another active load and connected to the power screw 708 is able to provide power to the additional active load.

FIG. 7 also shows that the 3-way switch 700 can include a first neutral screw 710a and a second neutral screw 710b (collectively "neutral screws 710"). Power flows from the power source to the power screw 708, through the 3-way switch, to either the first neutral screw 710a or the second neutral screw 710b to the other 3-way switch through the electrical device and back to the power source forming an electrical circuit.

During operation the first conducting strip 608a, FIG. 6 is in contact with the power screw 708, the second conducting strip 608b, FIG. 6 is in contact with the first neutral screw 710a and the third conducting strip 608c, FIG. 6 is in contact with the second neutral screw 710b. In at least one implementation, the first conducting strip 708a receives power supplied to the power screw 708. The power can then be delivered to a load 612, FIG. 6 within the cover plate 600, FIG. 6. The power is then returned to either the first neutral screw 710a through the second conducting strip 608b, FIG. 6 or the second neutral screw 710b through the third conducting strip 608c, FIG. 6.

One of skill in the art will appreciate that other configurations are possible depending on the wiring of the 3-way switch 700. For example, the cover plate 600 can include circuitry to determine active terminals and route power accordingly. Additionally or alternatively, the cover plate 600 can include a mechanical mechanism that transforms motion of the switch to movement of a conducting strip 608 to move the conducting strip 608 to the appropriate power screw 708. In addition, other elements may be necessary at other switch locations to ensure that the circuit through the load 712 does not complete the circuit to the attached electrical device. Additionally or alternatively, the conducting strips 608 can include a slide that allows the conducting strips 608 to be placed in any desired position. I.e., a user can place the conducting strips 608 in a desired position, depending on the wiring configuration of the switch to be attached to, before installation.

Figure 8:
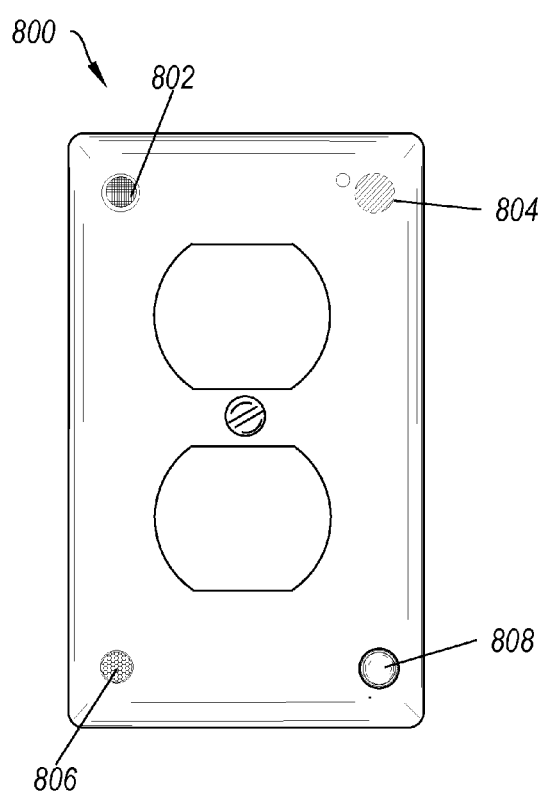
FIG. 8 illustrates an alternative example of a cover plate.

FIG. 8 illustrates an alternative example of a cover plate 800. In at least one implementation, the cover plate 800 can be used with an alternative load. In particular, the cover plate 800 can include loads that perform additional functions, as desired. One of skill in the art will appreciate that the loads disclosed herein are exemplary and any load is contemplated herein. I.e., any electrical device is contemplated herein and exemplary loads are not limiting unless specified in the claims.

FIG. 8 shows that the cover plate 800 can include a speaker 802. In at least one implementation, the speaker 802 can include an electroacoustic transducer that converts an electrical signal into sound that can be perceived by a user. Specifically, the speaker 802 can move in accordance with the variations of an electrical signal and causes sound waves to propagate through a medium. In particular, the speaker 802 can be used to produce sound from a data signal sent to the cover plate 800. The speaker 802 can be part of the cover plate 800 or can be an external device such as external speakers or headphones. For example, the speaker 802 can include a headphone jack.

FIG. 8 also shows that the cover plate 800 can include a sensor 804. In at least one implementation, the sensor 804 can include a device that measures a physical quantity and converts it into a signal which can be read by an observer or by an instrument. For example, the sensor 804 can include a thermocouple that converts temperature to an output voltage which can be read by a voltmeter. In particular, the sensor 804 can include a device which receives and responds to a signal. I.e., the sensor 804 changes its output signal based on changes in the parameter being measured. The sensitivity of the sensor 804 is an indication of how much the sensor's output changes when the measured quantity changes. For instance, if the mercury in a thermometer moves 1 cm when the temperature changes by 1° C., the sensitivity is 1 cm/° C. Ideal sensors are designed to be linear or linear to some simple mathematical function of the measurement, typically logarithmic. Additionally or alternatively, the sensor 804 can include a smoke detector, a carbon monoxide detector or any other desired sensor.

FIG. 8 further shows that the cover plate 800 can include a microphone 806. In at least one implementation, the microphone 806 can include an acoustic-to-electric transducer or sensor that converts sound into an electrical signal. I.e., the microphone 806 can include a device which converts sound into an electrical signal for recordation and/or transmission over a network. The microphone 806 can use electromagnetic induction (dynamic microphone), capacitance change (condenser microphone), piezoelectric generation, or light modulation to produce an electrical voltage signal from mechanical vibration.

FIG. 8 additionally shows that the cover plate 800 can include a photocell 808. In at least one implementation, the photocell can include a device that detects photons. The photons may be either in the visible range (such as in a camera or a motion detector) in the infrared range (such as in a heat detector or a motion detector). For example, in a camera, the photocell can convert the photons into an electrical signal that can be used to produce an image. Additionally or alternatively, the photo cell 808 can detect light levels to turn on or off other loads, such as a light.

Figure 9:
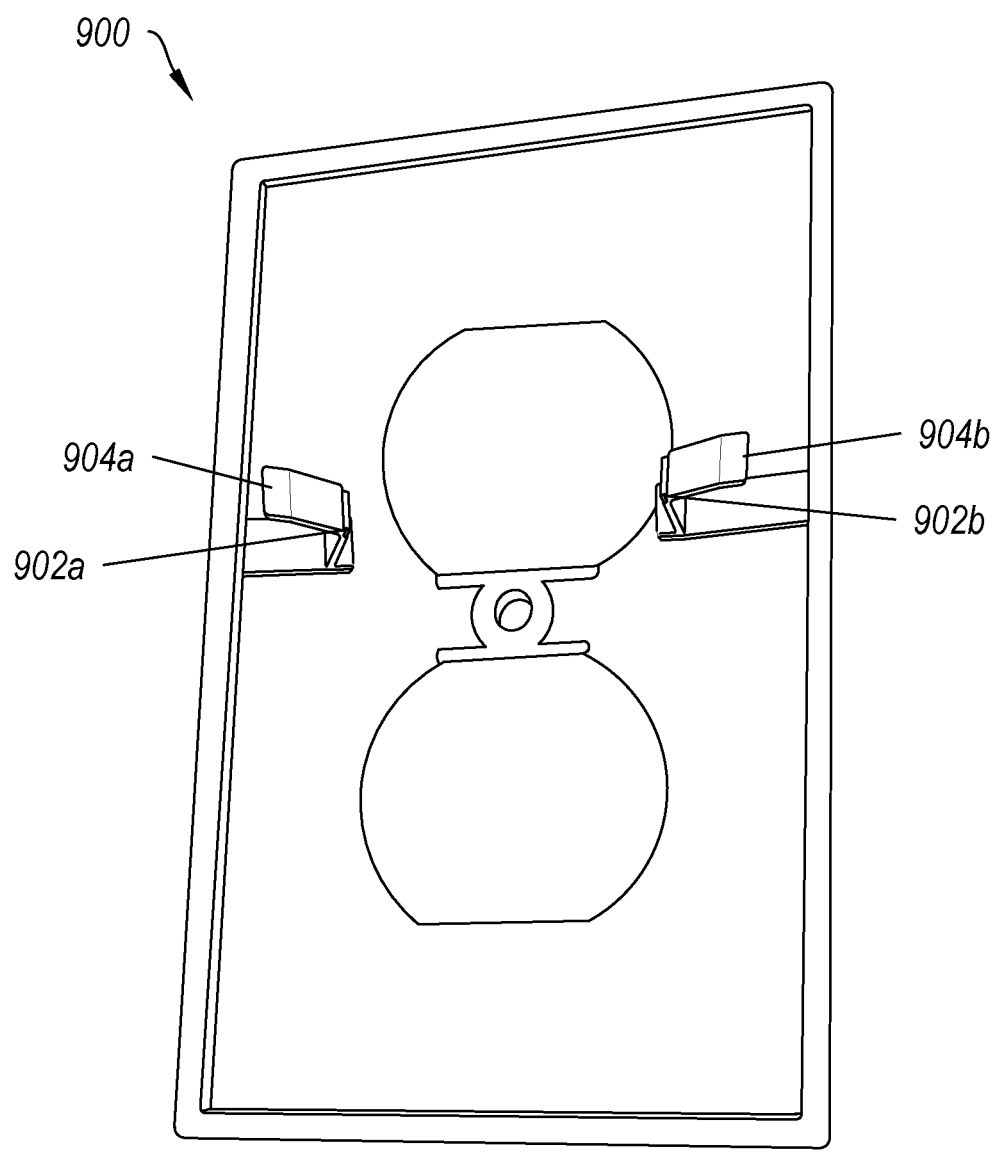
FIG. 9 illustrates an alternative example of a cover plate.

FIG. 9 illustrates an alternative example of a cover plate 900. In at least one implementation, the cover plate 900 includes an alternative method of insulating the connection between the cover plate 900 and the power source. I.e., as the cover plate 900 receives electrical power from the power source, it is important to prevent arcing or other hazards.

FIG. 9 shows that the cover plate 900 can include a first conducting strip 902a and a second conducting strip 902b (collectively "conducting strips 902"). In at least one implementation, the conducting strips 902 can allow the cover plate to draw power. I.e., the conducting strips 902 come in contact with the power connectors of the outlet, drawing power as needed, as described below.

FIG. 9 also shows that the cover plate 900 can include a first insulating cover 904a and a second insulating cover 904b (collectively "insulating covers 904"). In at least one implementation, the insulating covers 904 can prevent the conducting strips from forming a circuit with external materials. I.e., as the conducting strips 902 come in contact with the power connectors of the outlet, they bend outward. This flexibility insures that the conducting strips 902 remain in contact with the power connectors. However, it can also force the conducting strips 902 toward wires, the electrical box or other materials in the areas. The insulating covers 904 prevent the conducting strips from contacting the wires, electrical box or other materials. In addition, the insulating tabs 904 prevent arcing if the conducting strips 902 get too close to the wires, electrical box or other materials.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A cover plate for an electrical receptacle, the cover plate comprising:
    a first flexible conducting strip, wherein the first conducting strip:
        protrudes rearward from the cover plate; and
        is configured to contact a first terminal of a receptacle, wherein the first terminal is configured to connect the receptacle to a power source;
    a first insulating cover over the first conducting strip to prevent the first conducting strip from contacting conducting materials other than the first terminal;
    a second flexible conducting strip, wherein the second conducting strip:
        protrudes rearward from the cover plate; and
        is configured to contact a second terminal of the receptacle, wherein the second terminal is configured to complete the connection of the receptacle to the power source;
    a second insulating cover over the second conducting strip to prevent the second conducting strip from contacting conducting materials other than the second terminal; and
    an electrical load in the cover plate, wherein the load is electrically connected to the first terminal through the first conductive strip and is electrically connected to the second terminal through the second conductive strip.

2. The cover plate of claim 1, wherein the first and second conductive strips bend outward as the first and second conductive strips come in contact with the first and second terminals of a receptacle, wherein the first insulator and second insulator prevent the first and second conducting strips from electrically contacting an electrical box or wires in the electrical box when the first and second conductive strips bend outward.

3. The cover plate of claim 1, further comprising wiring embedded within the cover plate, wherein the wiring connects:
    the first conducting strip;
    the load; and
    the second conducting strip.

4. The cover plate of claim 1, wherein the receptacle comprises at least one of an outlet or a switch.

5. The cover plate of claim 1, wherein the first insulating cover is placed over an end of the first conductive strip and the second insulating cover is placed over an end of the second conductive strip.

6. The cover plate of claim 1, wherein the load includes a motion sensor.

7. The cover plate of claim 1, wherein the load includes a smoke detector.

8. The cover plate of claim 1, wherein the load includes a speaker.

9. The cover plate of claim 1, wherein the load includes a carbon monoxide detector.

10. The cover plate of claim 1, wherein the load comprises a light source and the cover plate further comprises a user controlled switch to dim the light source.

11. A cover plate for an electrical receptacle, the cover plate comprising:
    a first flexible conducting strip, wherein the first conducting strip:
        protrudes rearward from the cover plate; and
        is configured to contact a first terminal of a receptacle, wherein the first terminal connects the receptacle to a power source, wherein the first conducting strip bends outward as it contacts the first terminal;
    a first insulator, wherein the first insulator prevents the first conducting strip from contacting conducting materials other than the first terminal;
    a second flexible conducting strip, wherein the second conducting strip:
        protrudes rearward from the cover plate; and
        is configured to contact a second terminal of the receptacle, wherein the second conducting strip bends outward as it contacts the second terminal, wherein the second terminal completes the connection of the receptacle to the power source;
    a second insulator, wherein the second insulator prevents the second conducting strip from contacting conducting materials other than the second terminal;
    an electrical load in the cover plate; and wiring embedded within the cover plate, wherein the wiring connects:
   the first conducting strip to the load; and
   the second conducting strip to the load.

12. The cover plate of claim 11, wherein the first insulator comprises an insulating tab.

13. The cover plate of claim 11, wherein the first insulator and second insulator comprise insulating covers disposed over terminal ends of the first and second conducting strips.

14. The cover plate of claim 13, wherein the first insulator and second insulator prevent the first and second conducting strips from electrically contacting an electrical box or wires in the electrical box when conductive strips bend outward.

15. The cover plate of claim 11, wherein the first insulator comprises an insulating cover, wherein the insulating cover includes:
   an insulating material that covers at least a portion of the conducting strip; and
   an opening in the insulating material where the first conducting strip contacts the first terminal.

16. A cover plate for an electrical receptacle, the cover plate comprising:
   a faceplate, wherein the faceplate:
      is configured to cover an opening of an electrical box; and
      includes an aperture, wherein the aperture is configured to provide access to the receptacle within the electrical box;
   a first flexible conducting strip, wherein the first conducting strip:
      protrudes rearward from the faceplate; and
      is configured to contact a first terminal of the receptacle, wherein the first terminal connects the receptacle to a power source, wherein the first conducting strip bends outward as it contacts the first terminal;
   a second flexible conducting strip, wherein the second conducting strip:
      protrudes rearward from the faceplate; and
      is configured to contact a second terminal of the receptacle, wherein the second conducting strip bends outward as it contacts the second terminal, wherein the second terminal completes the connection of the receptacle to the power source;
   a light source in the faceplate, wherein the light source is configured to:
      convert electrical power to light; and
      project the light from the faceplate;
   a user controlled switch to dim the light source; and
   wiring embedded within the faceplate, wherein the wiring connects:
      the first conducting strip to the light source; and
      the second conducting strip to the light source.

17. The cover plate of claim 16, wherein the light source includes at least one light emitting diode, wherein user control changes the brightness of the at least one light emitting diode.

18. The cover plate of claim 17, wherein the light source includes a bank of light emitting diodes and the user control comprises manual input.

19. The cover plate of claim 16, further comprising a first insulating cover placed over an end of the first conductive strip and a second insulating cover placed over an end of the second conductive strip.

20. The cover plate of claim 16, wherein the light source is configured to project the light onto a nearby wall.

* * * * *